(12) United States Patent
Lee et al.

(10) Patent No.: US 8,236,647 B2
(45) Date of Patent: Aug. 7, 2012

(54) METHOD FOR FABRICATING NONVOLATILE MEMORY DEVICE

(75) Inventors: Juyul Lee, Seoul (KR); Seungjae Baik, Hwaseong-si (KR); Kihyun Hwang, Seongnam-si (KR); Siyoung Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 418 days.

(21) Appl. No.: 12/461,188

(22) Filed: Aug. 4, 2009

(65) Prior Publication Data

US 2010/0048012 A1    Feb. 25, 2010

(30) Foreign Application Priority Data

Aug. 21, 2008  (KR) .................. 10-2008-0081965

(51) Int. Cl.
*H01L 21/336*    (2006.01)

(52) U.S. Cl. ........ 438/257; 438/261; 438/264; 438/288; 438/591; 257/E21.422

(58) Field of Classification Search .................. 438/591, 438/257, 264, 287, 288, 261; 257/E21.422
See application file for complete search history.

(56) References Cited

U.S. PATENT DOCUMENTS

| | | | |
|---|---|---|---|
| 6,892,318 B2 * | 5/2005 | Blodgett | 714/6.32 |
| 7,442,989 B2 | 10/2008 | Kobayashi et al. | |
| 7,498,227 B2 | 3/2009 | Kim | |
| 2006/0261401 A1 * | 11/2006 | Bhattacharyya | 257/316 |
| 2008/0150008 A1 * | 6/2008 | Kim et al. | 257/324 |

FOREIGN PATENT DOCUMENTS

| | | |
|---|---|---|
| JP | 2004-179387 A | 6/2004 |
| KR | 10-2006-0015999 A | 2/2006 |
| KR | 10-0786707 B1 | 12/2007 |

* cited by examiner

*Primary Examiner* — Michael Trinh

(74) *Attorney, Agent, or Firm* — Lee & Morse, P.C.

(57) ABSTRACT

Provided is a method for fabricating a nonvolatile memory device capable of improving charge retention characteristics. The method for fabricating a nonvolatile memory device includes forming a charge trapping layer with a memory region and a charge blocking region on a semiconductor substrate, and trapping charges in the charge blocking region of the charge trapping layer.

20 Claims, 15 Drawing Sheets

METHOD FOR FABRICATING NONVOLATILE MEMORY DEVICE

BACKGROUND

1. Field

Example embodiments relate to a method for fabricating a nonvolatile memory device, and more particularly, to a method for fabricating a charge trap type nonvolatile memory device with improved reliability.

2. Description of the Related Art

A nonvolatile memory device is a device that can electrically erase and program data and can preserve data even if power is not supplied. Thus, use of the nonvolatile memory device increases in various fields.

The nonvolatile memory device may be classified into a floating gate type nonvolatile memory device and a charge trap type nonvolatile memory device depending on kinds of data storage layers constituting a unit cell. For example, the charge trap type nonvolatile memory device may realize low power consumption, low voltage operation, and high integration.

A conventional charge trap type nonvolatile memory device may include a charge trapping layer, a charge tunneling layer, and a charge blocking layer. The charge trapping layer may be used for injecting and storing charges. The charge tunneling layer and the charge blocking layer may be disposed on bottom and top surfaces of the charge-trapping layer, respectively. The charge trap type nonvolatile memory device may be classified into a silicon/oxide/nitride/oxide/silicon (SONOS) type nonvolatile memory device, a metal/nitride/oxide/silicon (MNOS) type nonvolatile memory device, and a metal/oxide/nitride/oxide/silicon (MONOS) type nonvolatile memory device depending on the materials of the charge trap type nonvolatile memory device.

SUMMARY

It is a feature of an embodiment to provide a method for fabricating a charge trap type nonvolatile memory device with improved charge retention characteristics.

At least one of the above and other features and advantages may be realized by providing a method for fabricating a nonvolatile memory device, including forming a charge trapping layer having a memory region and a charge blocking region on a semiconductor substrate, and trapping charges in the charge blocking region of the charge trapping layer.

Forming the charge trapping layer may include forming a plurality of memory regions and a plurality of charge blocking regions in the charge trapping layer. The charge trapping layer may be formed in a flat plate shape on the semiconductor substrate, such that the charge blocking regions surround each of the memory regions. The charge trapping layer may be formed in a line shape on the semiconductor substrate, such that each memory region is between two charge blocking regions. Trapping the charges in the charge blocking region may include electrically trapping charges from the semiconductor substrate in the memory region of the charge trapping layer, and diffusing at least a portion of the charges trapped in the memory region of the charge trapping layer into the charge blocking region of the charge trapping layer to trap the charges in the charge blocking region of the charge trapping layer. Diffusing the charges trapped in the memory region of the charge trapping layer into the charge blocking region may include thermally treating the charge trapping layer to diffuse the charges of the memory region into the charge blocking region. Thermally treating the charge trapping layer may include performing a bake process at a temperature ranging from about 100° C. to about 200° C. for a time period ranging from about one hour to about one hundred hours. Electrically trapping the charges in the memory region and diffusing the charges of the memory region into the charge blocking region are performed alternately and repeatedly two or more times. The method may further include selecting defective cells in memory cells of the nonvolatile memory device before and after the charges are trapped in the charge blocking region of the charge trapping layer. Trapping charges in the charge blocking region may be performed before the nonvolatile memory device is finalized as a finished product.

At least one of the above and other features and advantages may also be realized by providing a method for fabricating a nonvolatile memory device including preparing a semiconductor substrate including channel regions, forming a trap structure including a charge tunneling layer, a charge trapping layer, and a charge blocking layer on the semiconductor substrate, forming gate electrodes on the trap structure, trapping charges in the charge trapping layer over the channel regions, and laterally diffusing the charges trapped in the charge trapping layer over the channel regions to trap the charges in the charge trapping layer around the channel regions.

The channel regions may be arranged in a matrix shape. The trap structure may have a line shape, such that each trap structure and a respective gate electrode completely overlap each other, the charges being laterally diffused to overlap two sides of each region over a respective channel region. The trap structure may overlap a plurality of gate electrodes, such the charges are laterally diffused to surround a perimeter of each region over a respective channel region. Trapping the charges in the charge trapping layer over the channel regions may include generating an electric potential difference between the gate electrodes and the semiconductor substrate to tunnel the charges from the semiconductor substrate to the charge trapping layer. Laterally diffusing the charges trapped in the charge trapping layer disposed above the channel regions may include thermally treating the charge trapping layer. Thermally treating the charge trapping layer may include performing a bake process at a temperature ranging from about 100° C. to about 200° C. for a time period ranging from about one hour to about one hundred hours. The method may further include selecting defective cells in memory cells of the nonvolatile memory device after the gate electrodes are formed. The method may further include selecting defective cells in memory cells of the nonvolatile memory device after the charges are trapped in the charge trapping layer except the charge trapping layer over the channel region. Laterally diffusing charges may be performed before the nonvolatile memory device is finalized as a finished product.

BRIEF DESCRIPTION OF THE DRAWINGS

The above and other features and advantages will become more apparent to those of ordinary skill in the art by describing in detail exemplary embodiments with reference to the attached drawings, in which:

FIGS. 7A through 10A illustrate cross-sectional views along line A-A' of FIG. 6 illustrating a method for fabricating a nonvolatile memory device according to an embodiment;

FIGS. 7B through 10B illustrate cross-sectional views along line B-B' of FIG. 6 illustrating a method for fabricating a nonvolatile memory device according to an embodiment;

DETAILED DESCRIPTION

Figure 1:
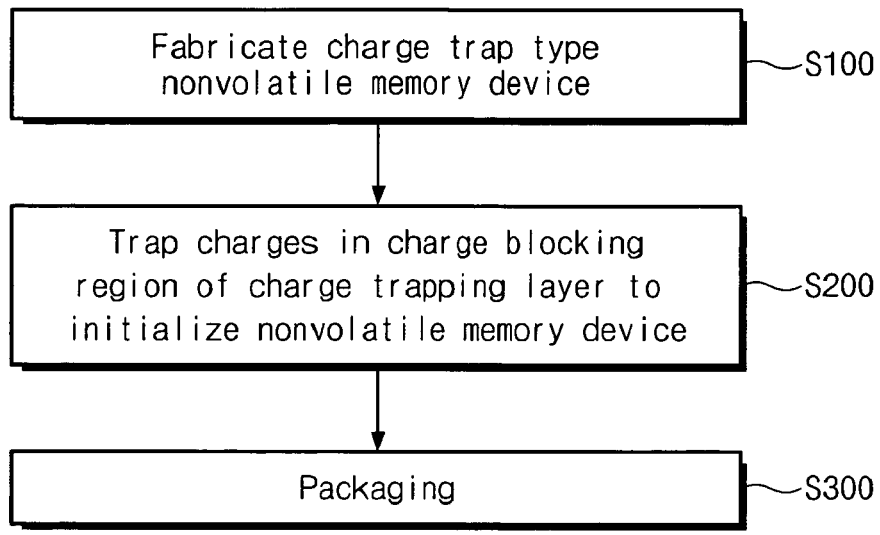
FIGS. 1 through 3 illustrate flowcharts of a method for fabricating a nonvolatile memory device according to an embodiment.

Korean Patent Application No. 10-2008-0081965, filed on Aug. 21, 2008, in the Korean Intellectual Property Office, and entitled: "Method for Fabricating Nonvolatile Memory Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the following description, the technical terms are used only for explaining a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etch area illustrated in a right angle shape may have a rounded shape or a shape having a predetermined curvature. Areas exemplified in the drawings have general properties, and are used to illustrate a specific shape of a semiconductor package region. Thus, this should not be construed as limited to the scope of the present invention.

Hereinafter, a method for fabricating a nonvolatile memory device according to embodiments will be described with the accompanying drawings. For example, embodiments may be applicable to a NOR type flash memory device, a one-NAND type flash memory device, a NAND type flash memory device, and so forth.

Figure 2:
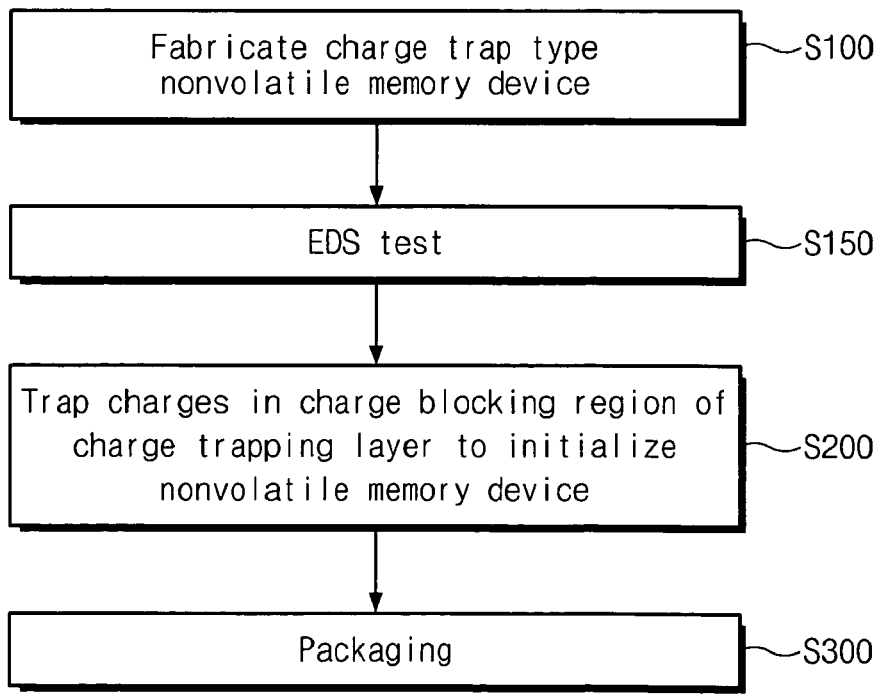
Figure 3:
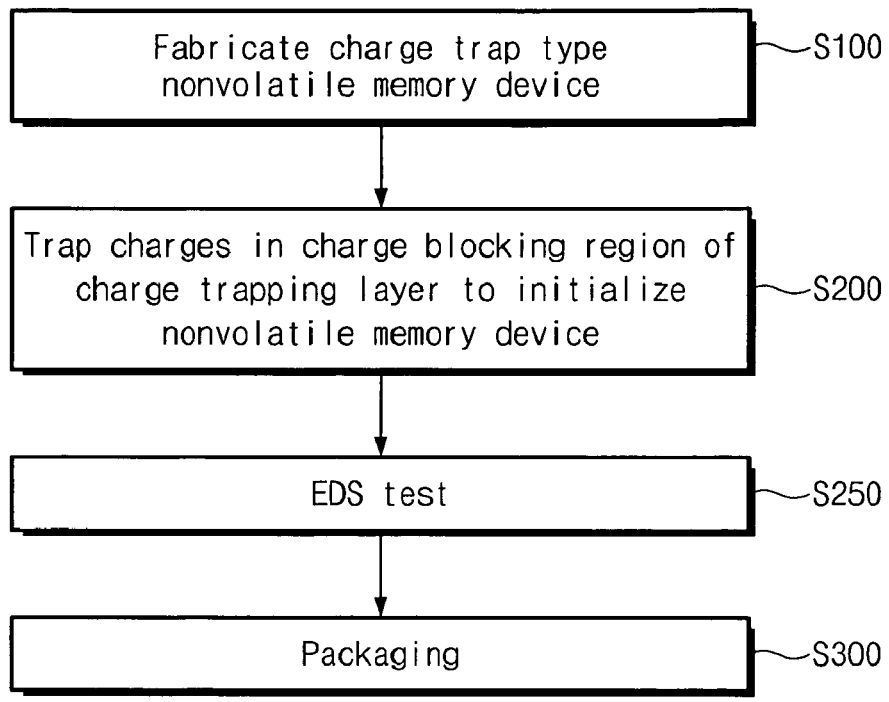

FIGS. 1 through 3 illustrate flowcharts of a method for fabricating a nonvolatile memory device according to embodiments.

Referring to FIG. 1, a charge trap type nonvolatile memory device including a plurality of memory cells may be completed in operation S100. A completed state of the nonvolatile memory device denotes a structurally complete device at a state capable of performing, i.e., structurally, electrical operations, e.g., a programming operation, an erasing operation, and/or a reading operation. That is, the completed nonvolatile memory device after operation S100 may be a device before or after being tested or a device before being shipped as a product to be sold. In detail, the completed nonvolatile memory device in operation S100 may include a charge trapping layer with a plurality of memory regions and a plurality of charge blocking regions, as will be explained in more detail below.

After the charge trap type nonvolatile memory device is completed in operation S100, charges may be trapped in the charge blocking regions of the charge trapping layer in operation S200 in order to initialize the nonvolatile memory device. An initialized nonvolatile memory device denotes a device at a state electrically prepared to begin the electrical operations of the nonvolatile memory device, i.e., operations for reading, writing, and erasing information are not performed yet. A method for initializing the nonvolatile memory device will be described in more detail below with reference to FIG. 4.

After the nonvolatile memory device is initialized, a packaging process may be performed on the nonvolatile memory device in operation S300. That is, when the charges are trapped in the charge blocking regions of the charge trapping layer, the nonvolatile memory device may be packaged and shipped as a product to be sold. In other words, once the charges are trapped in the charge blocking regions of the charge trapping layer in operation S200, the electrical operations of the nonvolatile memory device, e.g., programming, erasing, and/or reading, may be performed repeatedly to operate the nonvolatile memory device, so the nonvolatile memory device may be packaged and shipped as a product. At this point, the charges trapped in the charge blocking regions of the charge trapping layer may prevent or substantially minimize lateral diffusion of charges trapped in the memory regions of the charge trapping layer, as will be discussed in more detail below.

Referring to FIGS. 2 and 3, before and/or after the nonvolatile memory device is initialized in operation S200, a process for selecting defective cells may be performed with respect to the memory cells of the nonvolatile memory device.

As illustrated in FIG. 2, after the nonvolatile memory device is completed in operation S100, a defective cell selection test, i.e., an electrical die sorting (EDS) test, may be performed with respect to the memory cells of the completed nonvolatile memory device in operation S150. For example, electrical signals may be applied to the completed nonvolatile memory device to evaluate electrical characteristics thereof. Once the nonvolatile memory device is tested in operation S150, charges may be trapped in the charge blocking regions of the charge trapping layer, i.e., in non-defective cells, to initialize the nonvolatile memory device in operation S200. As illustrated in FIG. 3, after the nonvolatile memory device is initialized, the EDS test may be performed with respect to the memory cells in operation S250. The EDS test may be respectively performed before and/or after the nonvolatile memory device is initialized.

Figure 4:
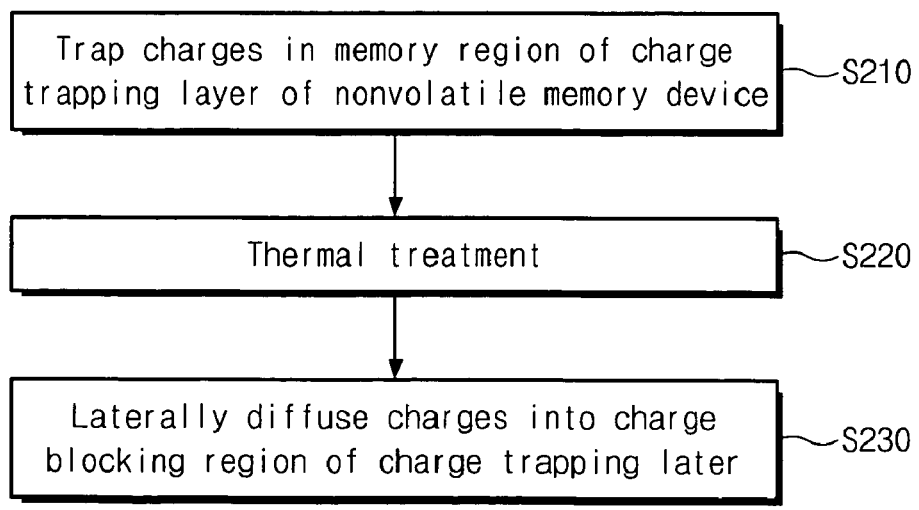
FIG. 4 illustrates a simplified flowchart of an initialization method of a nonvolatile memory device according to an embodiment.

FIG. 4 illustrates a simplified flowchart of an initialization method of a nonvolatile memory device according to embodiments.

Referring to FIG. 4, charges from a substrate may be trapped in memory regions of a charge trapping layer using an electrical method in operation S210. That is, memory cells of a nonvolatile memory device may be programmed to trap charges from the substrate in the memory regions of the charge trapping layer. In the programming of the memory cells, the charges may be trapped in the memory regions using a Fowler-Nordheim (F-N) tunneling method or a hot carrier injection (HCI) method.

In operation S220, a thermal treatment process may be performed with respect to the nonvolatile memory device, i.e., on the charges trapped in the memory regions of the charge trapping layer. In operation S230, the charges trapped in the memory regions of the charge trapping layer may be laterally diffused into the charge blocking regions of the charge trapping layer due to the thermal treatment process. The diffusion of the charges into the charge blocking regions of the charge trapping layer may complete the initialization of the nonvolatile memory device, i.e., set the nonvolatile memory device at an initialized state ready for electrical operations.

When the nonvolatile memory device according to embodiments performs electrical operations, charges in the memory regions of the charge trapping layer may not diffuse out of the memory regions during the electrical operations or over time. In particular, the charge blocking regions of the charge trapping layer may surround the memory regions of the charge trapping layer and may block lateral diffusion of charges out of the memory regions, e.g., over time, thereby improving charge storage in the charge trapping layer. In contrast, in a conventional charge trap type nonvolatile memory device, charges stored in the charge trapping layer may laterally diffuse by the passage of time or an external stress, so data stored within the nonvolatile memory device may be lost, thereby reducing reliability of the nonvolatile memory device. In embodiments, however, the charges trapped in the charge blocking regions during the initialization process, i.e., operation S200, may block lateral diffusion of charges out of the memory regions into the blocking regions, so lateral diffusion of charges out of the memory regions during electrical operation of the nonvolatile memory or after passage of a predetermined time may be prevented or substantially minimized.

A method for fabricating a nonvolatile memory device according to an embodiment will now be described in more detail with reference to FIGS. 5, 6, and 7A-10B.

Figure 5:
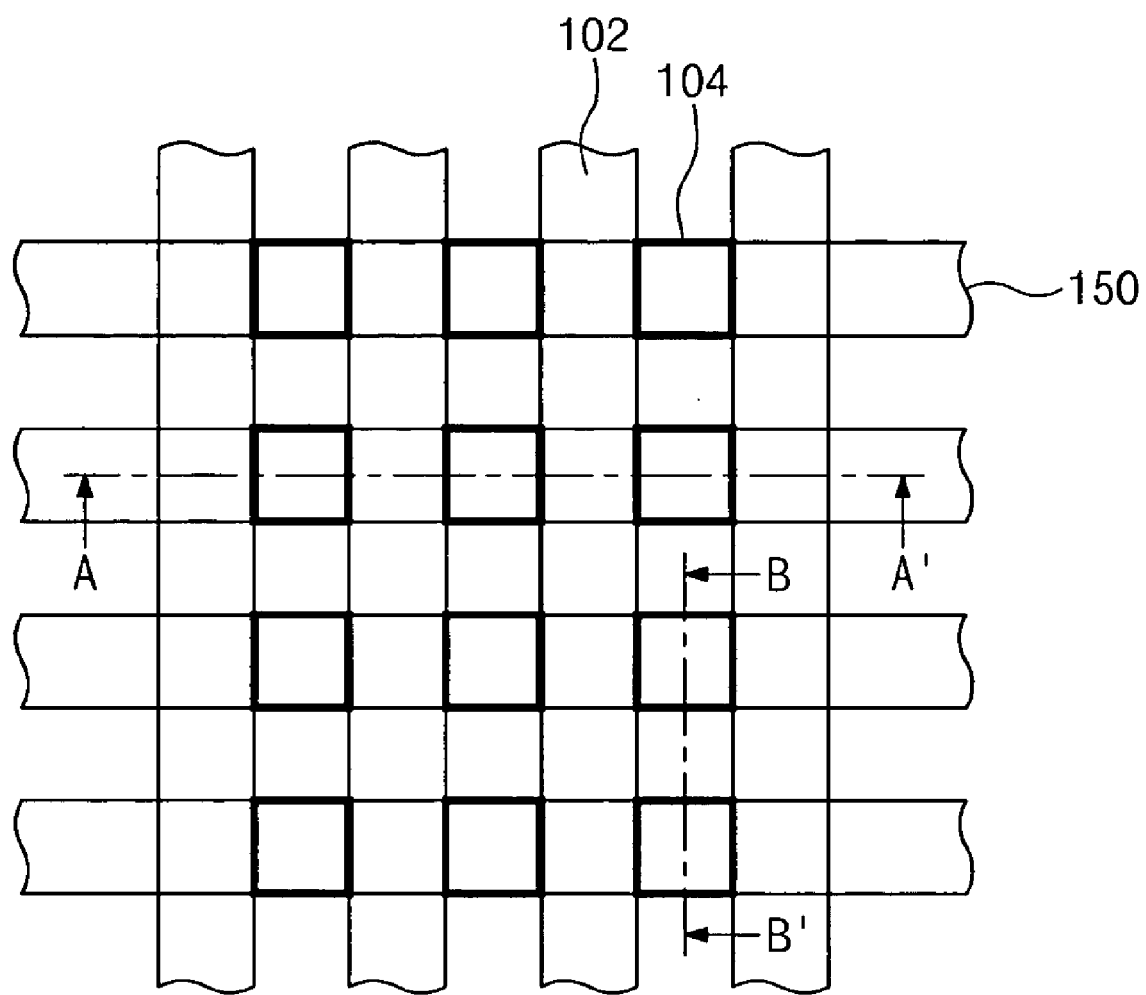
FIG. 5 illustrates a plan view of a nonvolatile memory device according to an embodiment.
Figure 6:
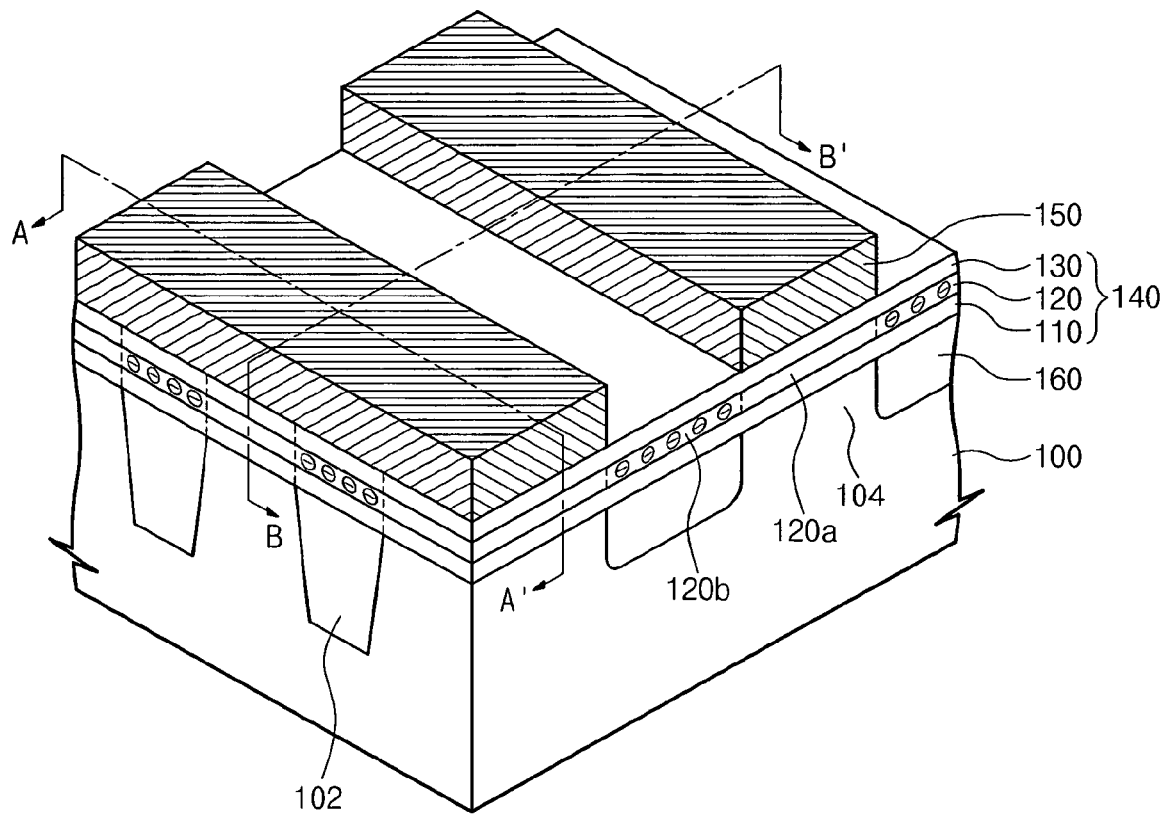
FIG. 6 illustrates a perspective view of a nonvolatile memory device according to an embodiment.

FIG. 5 illustrates a plan view of a nonvolatile memory device according to an embodiment. FIG. 6 illustrates a perspective view of a nonvolatile memory device according to an embodiment. FIGS. 7A through 10A illustrate cross-sectional views of a method for fabricating a nonvolatile memory device along line A-A' of FIG. 6. FIGS. 7B through 10B illustrate cross-sectional views of a method for fabricating a nonvolatile memory device along line B-B' of FIG. 6.

Referring to FIGS. 5, 6, and 7A-7B a semiconductor substrate 100 may be prepared. The semiconductor substrate 100 may include, e.g., at least one of a bulk silicon substrate, a silicon-on-insulator (SOI) substrate, a germanium substrate, a germanium-on-insulator (GOI) substrate, a silicon germanium substrate, and an epitaxial thin-film substrate obtained using a selective epitaxial growth (SEG) technique.

Device isolation layers 102 may be formed in the semiconductor substrate 100 to define active regions. For example, trenches may be formed in the semiconductor substrate 100, and an insulation layer may be filled in the trenches to form the device isolation layers 102. Each of the device isolation layers 102 may have a planar structure having a line shape, and the device isolation layers 102 may be spaced a predetermined distance from each other. Thus, active regions having line patterns may be defined in the semiconductor substrate 100 between the device isolation layers 102.

A trap structure 140 may be formed on an entire surface of the semiconductor substrate 100 in which the active regions are defined. The trap structure 140 may include a charge tunneling layer 110, a charge trapping layer 120, and a charge blocking layer 130, which may be sequentially stacked on the entire surface of the semiconductor substrate 100.

The charge tunneling layer 110 may function as a layer through which charges are tunneled when a high electric field is formed between gate electrodes 150 and a channel region of the semiconductor substrate 100. For example, the charge tunneling layer 110 may be formed of silicon oxide ($SiO_2$). In another example, the charge tunneling layer 110 may be formed of high-k materials, e.g., one or more of $Al_2O_3$, $HfO_2$, $ZrO_2$, $La_2O_3$, $TiO_2$, $SrTiO_3$ (STO), (Ba, Sr)$TiO_3$ (BST), and a compound layer stacked using their combinations. The charge tunneling layer 110 may be formed using a chemical vapor deposition (CVD) method or an atomic layer deposition (ALD) method.

The charge trapping layer 120 may trap charges tunneled from the channel region of the semiconductor substrate 100 through the charge tunneling layer 110 in order to store the charges. For example, the charge trapping layer 120 may be formed by depositing $Si_xN_y$. In another example, the charge trapping layer 120 may be formed of metal nitride or metal oxy-nitride instead of the $Si_xN_y$.

The charge blocking layer 140 may insulate the charge trapping layer 120 from the gate electrodes 150. The charge blocking layer 140 may be formed of high-k materials, e.g., one or more of $Al_2O_3$, $HfO_2$, $ZrO_2$, $La_2O_3$, $TiO_2$, $SrTiO_3$ (STO), (Ba, Sr)$TiO_3$ (BST), and a compound layer stacked using their combinations. The charge blocking layer 140 may be formed of a material having a dielectric constant greater than that of the charge tunneling layer 110.

The gate electrodes 150 may be formed on the trap structure 140. A conductive layer for a gate may be deposited on the trap structure 140, and may be patterned to form the gate electrodes 150. Each of the gate electrodes 150 may have a line shape crossing the active regions.

An ion injection process may be performed in the active regions at both sides of the gate electrode 150 to form source and drain regions 160 in the semiconductor substrate 100.

Thus, a plurality of memory cells may be formed on the semiconductor substrate 100. Interconnections (not shown) electrically connected to the memory cells may be formed on the gate electrodes 150 to complete a nonvolatile memory device. That is, an electrically operable nonvolatile memory device may be prepared, i.e., a completed charge trap type nonvolatile memory device as completed in operation S100 of FIG. 1.

Figure 7A:
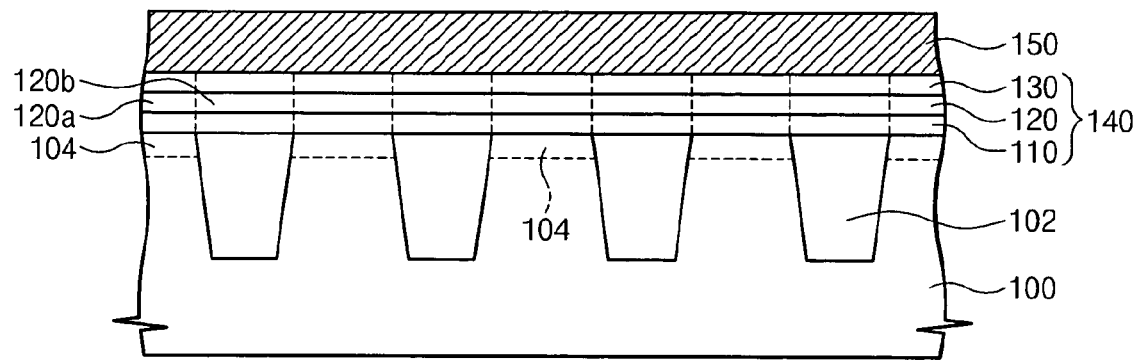
Figure 7B:
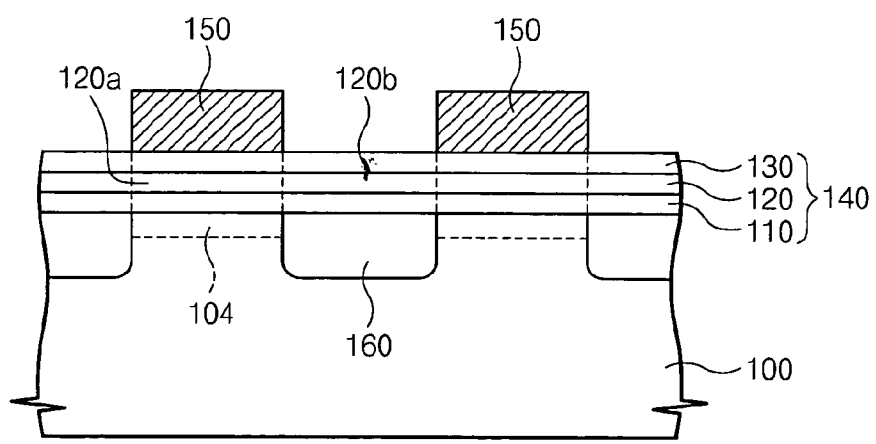

As illustrated in FIGS. 6 and 7A-7B, in the completed nonvolatile memory device, channel regions 104 may be defined below the gate electrodes 150 between the source and drain regions 160. Since the gate electrodes 150 and the device isolation layers 102 intersect each other, as illustrated in FIG. 5, the channel regions 104 may be under the gate electrodes 150, and may be defined between the source and drain regions 160 along a first direction and between adjacent device isolation layers 102 along a second direction perpendicular to the first direction. For example, as illustrated in FIG. 5, the channel regions 104 may be a plurality of discrete regions spaced apart from each other and arranged in a matrix pattern The charge trapping layer 120 may be on the semiconductor substrate 100, and may be divided into a plurality of memory regions 120a and a plurality of charge blocking regions 120b. The memory regions 120a of the charge trapping layer 120 may be defined above the channel regions 104, e.g., only above the channel regions 104, and may store charges. For example, the memory regions 120a of the charge trapping layer 120 may be arranged in a matrix pattern corresponding to the matrix pattern of the channel regions 104, e.g., the memory regions 120a and the channel regions 104 may completely overlap each other. The charge blocking regions 120b of the charge trapping layer 120 may be defined around the memory regions 120a, e.g., the charge blocking regions 120b may be arranged to completely surround a perimeter of each memory region 120a. That is, the charge blocking regions 120b of the charge trapping layer 120 may be defined above the device isolation layer 102, e.g., to completely overlap the device isolation layer 102, and above the source and drain regions 160, e.g., to completely overlap the source and drain regions 160. For example, the charge blocking regions 120b of the charge trapping layer 120 may have a grid pattern, so the line patterns of the grid pattern may surround each of the memory regions 120a. Charges may be trapped in the charge blocking regions 120b of the charge trapping layer 120 to initialize the nonvolatile memory device using the method described with reference to FIG. 4.

Trapping of charges in the charge blocking regions 120b, i.e., initialization of the nonvolatile memory device, will be described in more detail with reference to FIGS. 8A-10B. FIGS. 8A-10A illustrate cross-sectional views along line A-A' of FIG. 6. FIGS. 8B-10B illustrate cross-sectional views along line B-B' of FIG. 6.

Figure 8A:
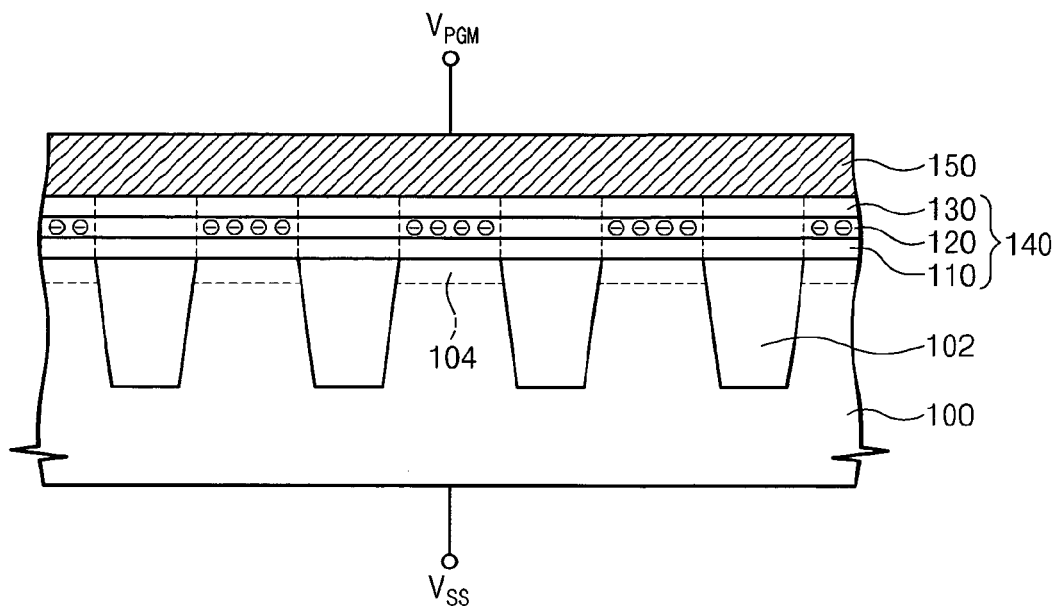
Figure 8B:
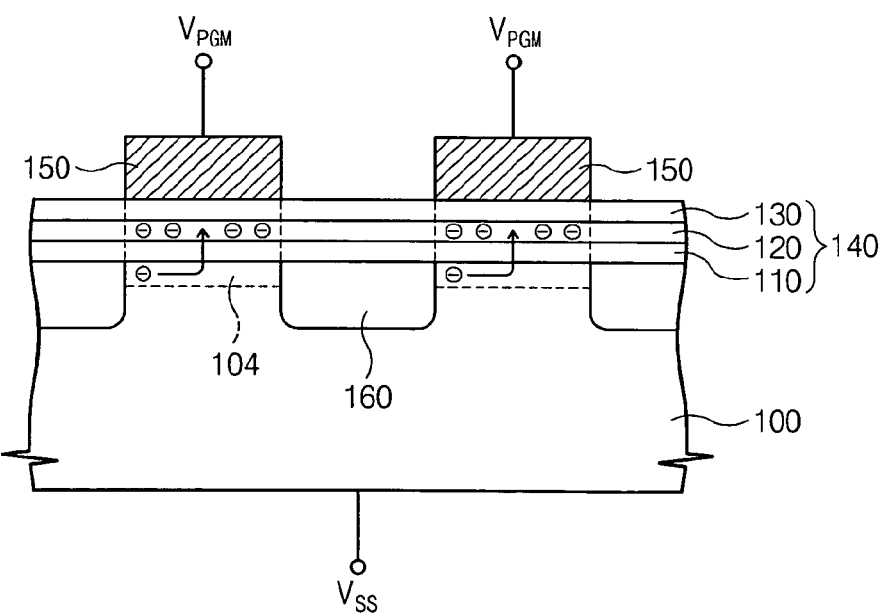

Referring to FIGS. 8A-8B, once the nonvolatile memory device is complete, e.g., in operation S100, charges may be trapped in the memory regions 120a of the charge trapping layer 120 from the semiconductor substrate 100 in operation S210 described with reference to FIG. 4, i.e., programming. Here, the programming may be performed using an electrical method. That is, the memory cells of the nonvolatile memory device may be programmed to trap the charges in the memory regions 120a of the charge trapping layer 120. The charges may be trapped in the memory regions 120a of the charge trapping layer 120 using a F-N tunneling method or a HCI method.

In detail, an electric potential difference may be generated between the gate electrode 150 and the semiconductor substrate 100 to tunnel the charges from the semiconductor substrate 100 to the charge trapping layer 120. That is, a program voltage $V_{PGM}$, e.g., a high voltage ranging from about 5V to about 10V, may be applied to the gate electrode 150, and a ground voltage $V_{SS}$ may be applied to the semiconductor substrate 100. Thus, the charges may be tunneled from the channel region 104 defined below the gate electrode 150 through the charge tunneling layer 110, and may be trapped in a portion of the charge trapping layer 120 disposed above the channel region 104. As a result, the charges may be distributed in the memory regions 120a of the charge trapping layer 120.

Figure 9A:
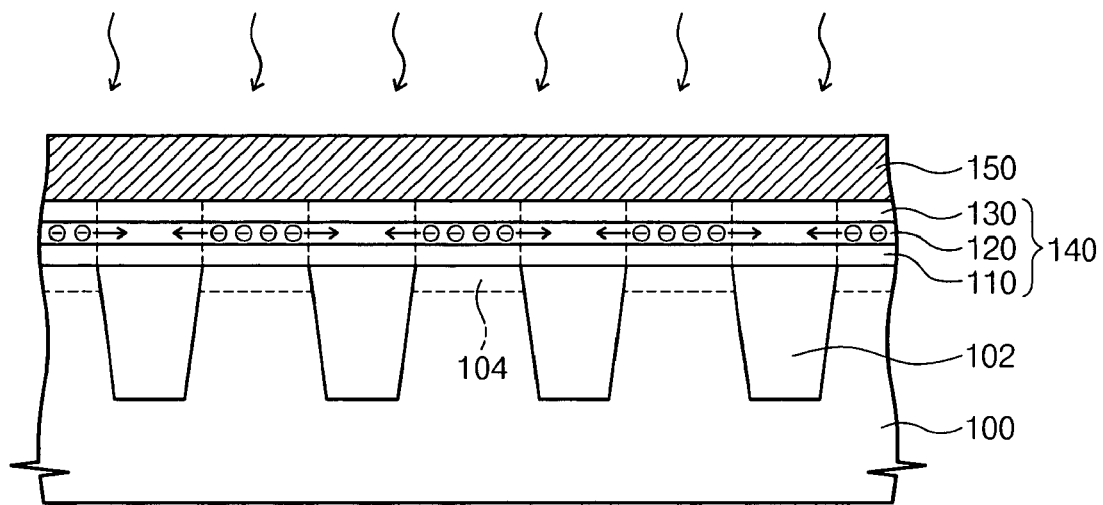
Figure 9B:
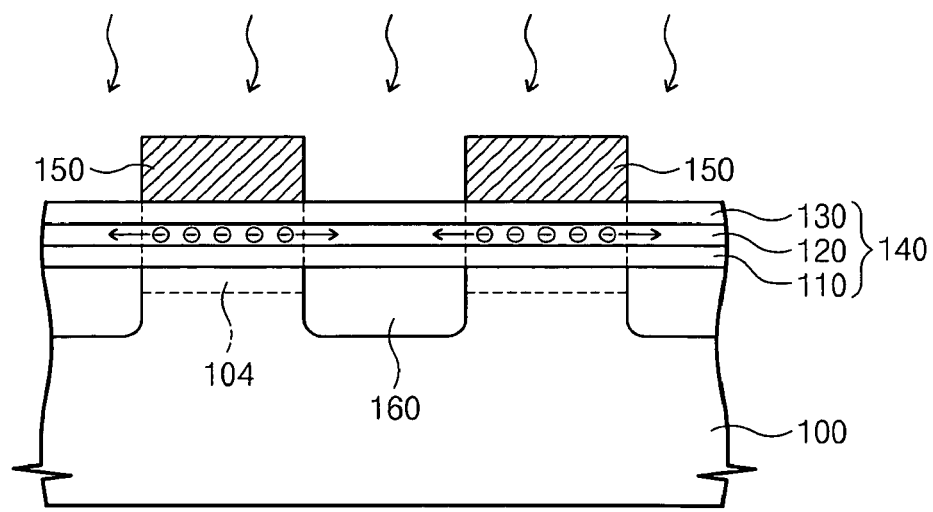

Referring to FIGS. 9A and 9B, a thermal treatment process may be performed on the nonvolatile memory device, i.e., operation S220 of FIG. 4. Therefore, the thermal treatment process may affect the charges trapped in the memory regions 120a of the charge trapping layer 120.

The charges trapped in the memory regions 120a of the charge trapping layer 120 may be movable into the charge blocking regions 120b of the charge trapping layer 120 due to the thermal treatment process with respect to the nonvolatile memory device. That is, the thermal treatment process may cause movement of the charges from the memory regions 120a into the charge blocking regions 120b. The thermal treatment process may be performed under a process condition in which the charges of the memory regions 120a may be sufficiently movable into the charge blocking regions 120b.

For example, the thermal treatment process may include a bake process. The bake process may be performed at a temperature ranging from about 100° C. to about 200° C. for a time period ranging from about one hour to about one hundred hours. That is, the temperature and the time period may be adjusted so that the charges, e.g., all the charges, in the memory regions 120a may move into the charge blocking regions 120b surrounding the memory regions 120a.

In other words, the thermal treatment process of the nonvolatile memory device may cause thermal diffusion of charges from the memory regions 120a of the charge trapping layer 120, so the charges may laterally diffuse from the memory regions 120a into the charge blocking regions 120b around the memory regions 120a. Since movement of charges from the memory regions 120a to the charge blocking regions 120b is due to the lateral diffusion, charge density within the charge blocking regions 120b may not be uniform. That is, the charge density at edge portions of the charge blocking regions 120b may be lower than that of central portions thereof.

The thermal treatment process may be repetitively performed two or more times in order to increase the charge density within the charge blocking regions 120b. In addition, the programming process and the thermal treatment process, i.e., operations S210-S230 in FIG. 4, may be performed alternately and repetitively two or more times, e.g., to provide sufficient charge density in the charge blocking regions 120b for blocking lateral diffusion from the memory regions 120a.

Figure 10A:
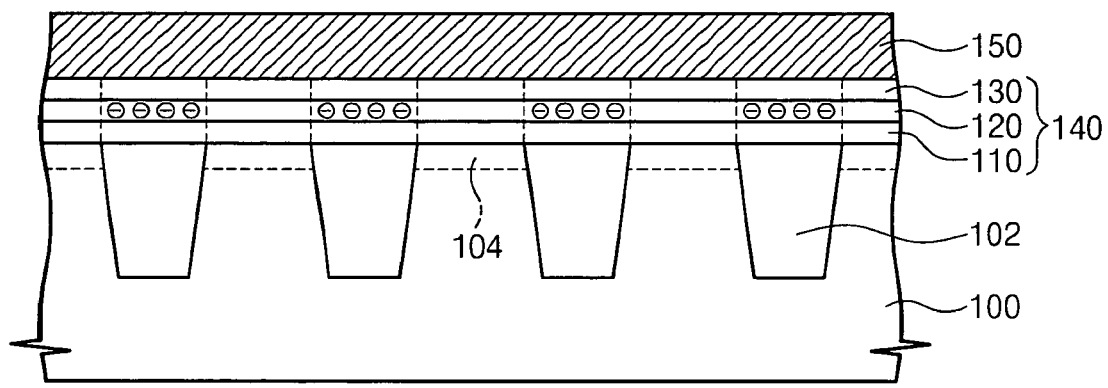
Figure 10B:
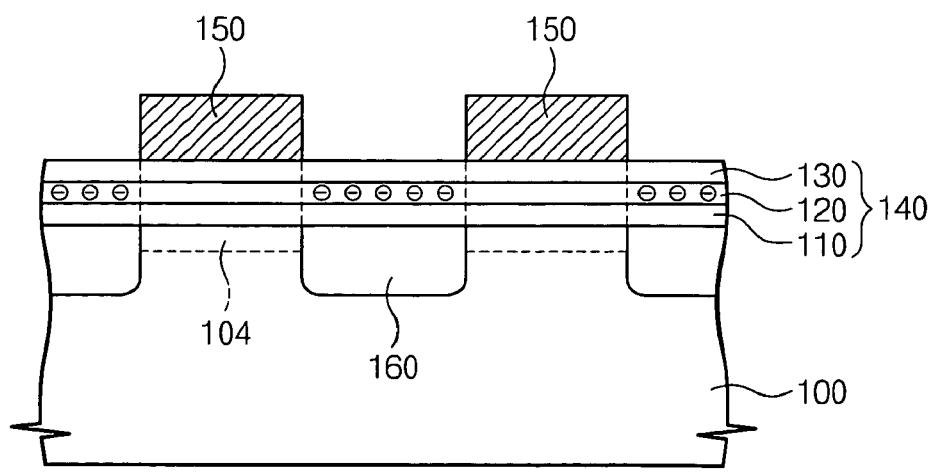

After the memory cells of the nonvolatile memory device are programmed, the thermal stress may be applied to the nonvolatile memory device to move the charges of the memory regions 120a of the charge trapping layer 120 into the charge blocking regions 120b. Thus, as illustrated in FIGS. 10A and 10B, the charges may be trapped in the charge blocking regions 120b of the charge trapping layer 120 to complete initialization of the nonvolatile memory device, i.e., operation S230.

Although the charges may be laterally diffused using the thermal treatment process in order to trap the charges in the charge blocking regions 120b of the charge trapping layer 120 in an embodiment, embodiments are not limited thereto. For example, any method providing thermal stress to the nonvolatile memory device in a state where the charges are trapped in the memory regions 120a may be applicable. Also, a method in which the charges are directly trapped in the charge blocking regions 120b of the charge trapping layer 120 may be applicable.

Since the charges of the memory regions 120a are moved into the charge blocking regions 120b due to thermal diffusion, some of the charges may remain trapped in the memory regions 120a of the charge trapping layer 120. Therefore, an erasing process may be performed in order to remove charges remaining in the memory regions 120a, so, e.g., at the end of the initialization process all charges may be trapped only in the charge blocking regions 120b, as illustrated in FIGS. 10A-10B.

Thereafter, a packaging process may be performed on the nonvolatile memory device to ship the nonvolatile memory device, in which the charges are trapped in the charge blocking regions 120b, as a product to be sold. Thus, programming, erasing, and reading operations may be repeated in the nonvolatile memory device in a state where the charges are trapped in the charge blocking regions 120b of the charge trapping layer 120. At this point, the charges trapped in the charge blocking regions 120b of the charge trapping layer 120 may prevent lateral diffusion of charges out of the memory regions 120a, e.g. after the nonvolatile memory device is shipped and used as a product.

Figure 11:
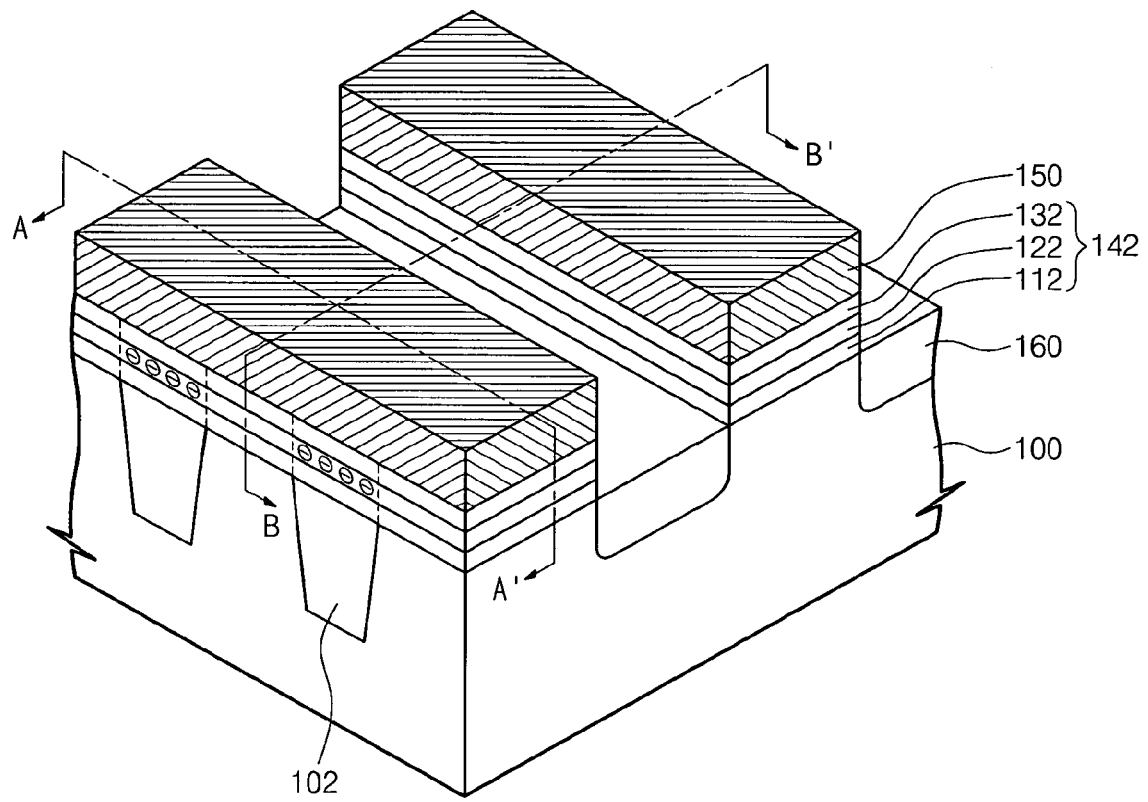
FIG. 11 illustrates a perspective view of a nonvolatile memory device according to another embodiment.
Figure 12A:
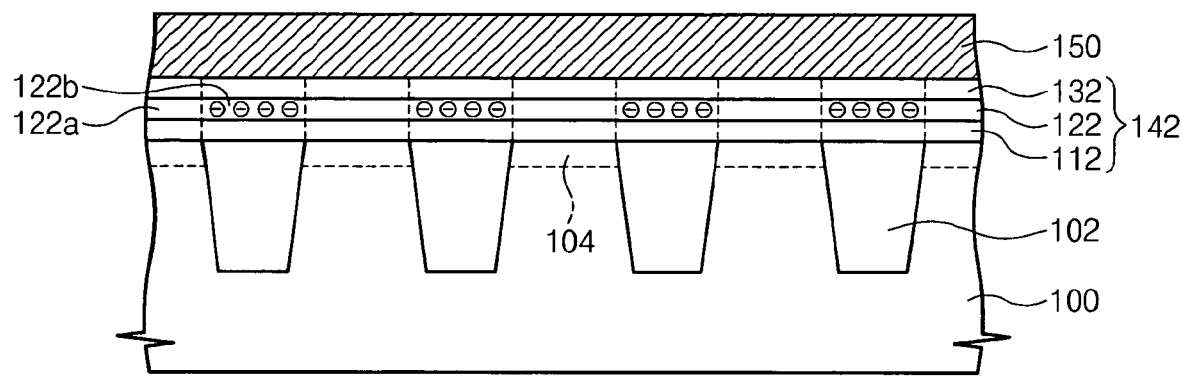
FIGS. 12A and 12B illustrate cross-sectional views along lines A-A' and B-B' of FIG. 11, respectively.
Figure 12B:
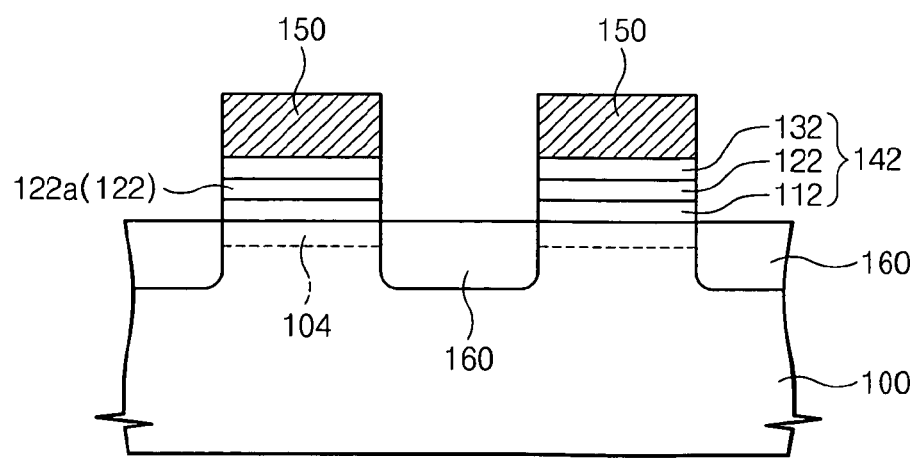

A method for fabricating a nonvolatile memory device according to another embodiment will be described with reference to FIGS. 11, 12A, and 12B. FIG. 11 illustrates a perspective view of a nonvolatile memory device according to another embodiment. FIGS. 12A and 12B illustrate cross-sectional views along lines A-A' and B-B' of FIG. 11, respectively.

Referring to FIGS. 11, 12A, and 12B, in a nonvolatile memory device according to another embodiment, a trap structure 142 and the gate electrode 150 may be formed in a line shape on the semiconductor substrate 100. That is, a charge tunneling layer (not shown), a charge trapping layer (not shown), a charge blocking layer (not shown), and a conductive layer (not shown) may be sequentially stacked on an entire surface of the semiconductor substrate 100 in which the active regions are defined. Then, the conductive layer may be patterned into a line shape to form the gate electrode 150. The charge tunneling layer, the charge trapping layer, and the charge blocking layer may be patterned using the gate electrode 150 as a mask to form a charge tunneling layer pattern 112, a charge trapping layer pattern 122, a charge blocking layer pattern 132, and the gate electrode 150 to have line shapes substantially overlapping each other. Thus, the trap structure 142 having the line shape may cross the isolation device layers 102, and may be substantially parallel to the gate electrodes 150. The source and drain regions 160 may be defined in both sides of the gate electrode 150 of the semiconductor substrate 100, e.g., the trap structure 142 may be defined between the source and drain regions 160. The channel region 104 may be defined below the gate electrode 150 and between the source and drain regions 160 of the semiconductor substrate 100, e.g., the channel region 104 and the trap structure 142 may completely overlap each other.

In the trap structure 142 having the line shape, the charge trapping layer 122 may include memory regions 122a and charge blocking regions 122b. The memory regions 122a of the charge trapping layer 122 may be disposed above the channel regions 104, and the blocking regions 122b may be disposed between the memory regions 122a, respectively. That is, the charge blocking regions 122b of the charge trapping layer 122 may be regions except the memory regions 122a. In other words, the memory regions 122a may be substantially the same as the memory regions 120a described previously, e.g., the memory regions 122a may be disposed under the gate electrodes 150 in a matrix pattern to overlap the channel regions 104, and the blocking regions 122b may be disposed under the gate electrodes 150, e.g., only under the gate electrode 150, between adjacent memory regions 122a, e.g., to overlap the isolation device layers 102. It is noted that since the trap structure 142 has a line shape, no portions of the charge trapping layer 122 may overlap the source and drain regions 160.

In the nonvolatile memory device illustrated in FIGS. 11 and 12A-12B, charges may be trapped in the charge blocking regions 122b of the charge trapping layer 122 to initialize the nonvolatile memory device. That is, the nonvolatile memory device may be programmed to trap the charges in the memory regions 122a of the charge trapping layer 122, and then a thermal treatment process may be performed to laterally diffuse the charges from the memory regions 122a into the charge blocking regions 122b. At this point, the charges of the memory regions 122a may be laterally diffused only under the gate electrode 150 because the trap structure 142 may not include portions of the charge trapping layer 122 that overlap the source and drain regions 160. The programming and thermal treatment processes of the nonvolatile memory device may be alternately performed two or more times.

As a result, the charges may be trapped in the charge blocking regions 122b of both sides of the memory regions 122a. Thus, when the nonvolatile memory device repeatedly operates, the charges within the charge blocking region 122b may prevent the charges trapped in the memory regions 122a from being moved outside the memory regions 122a.

Figure 13:
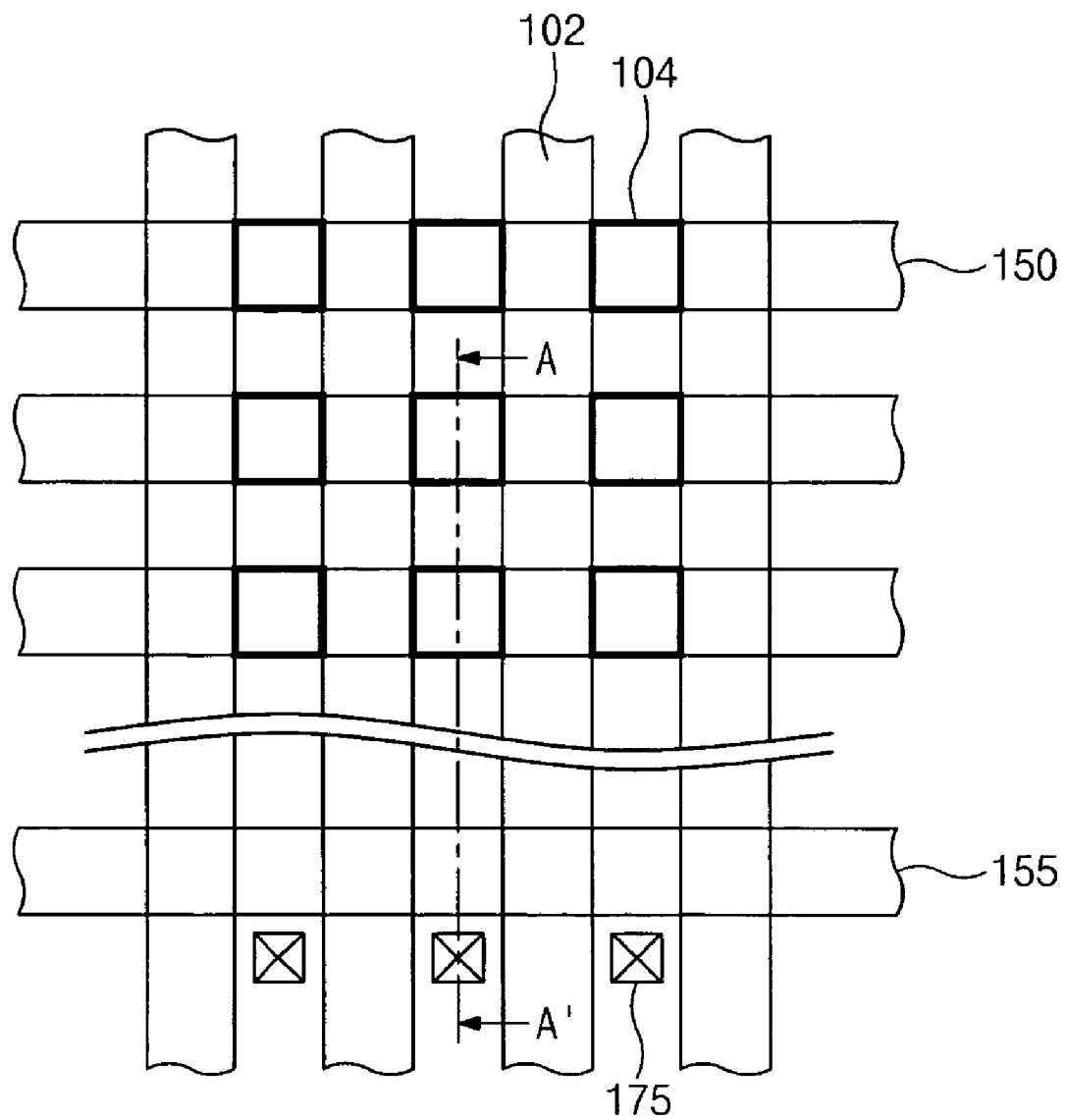
FIG. 13 illustrates a plan view of a nonvolatile memory device according to another embodiment.
Figure 14:
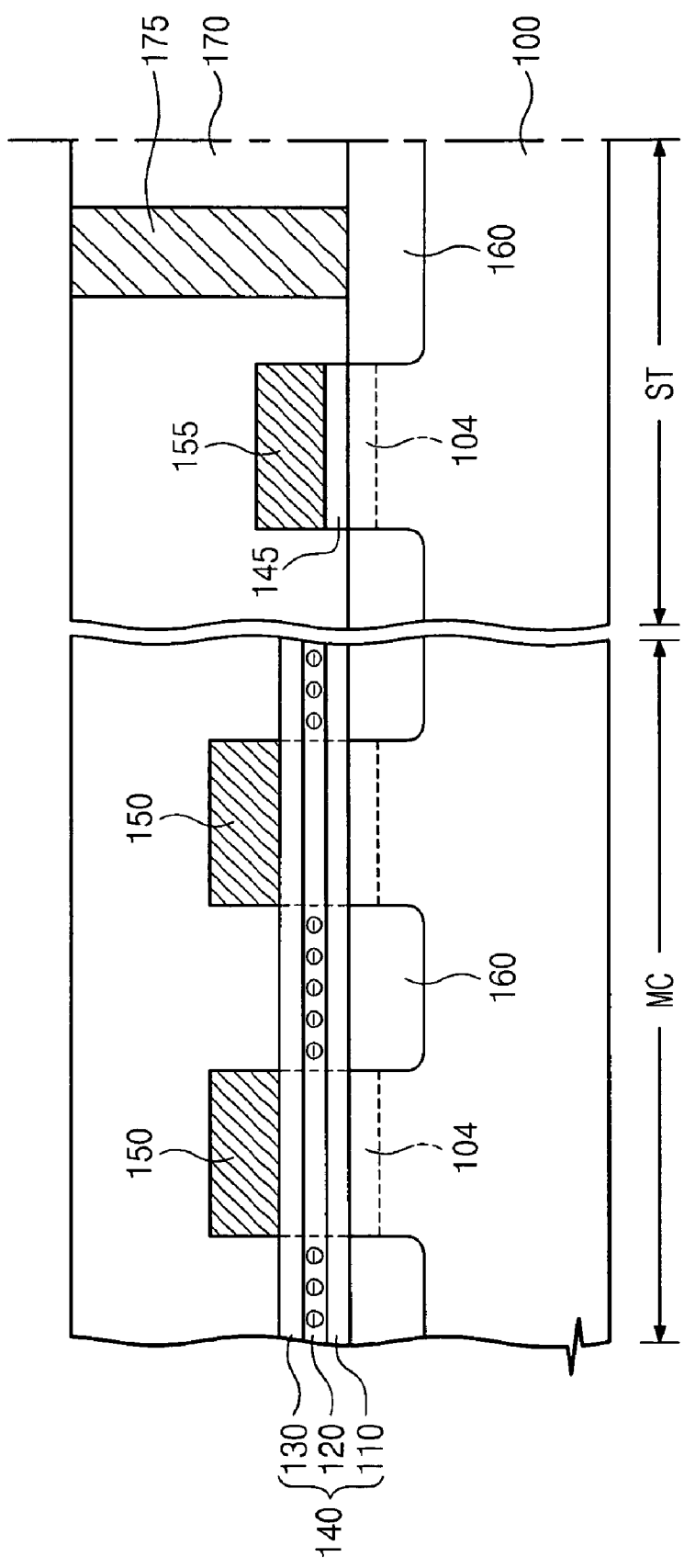
FIG. 14 illustrates a cross-sectional view along line A-A' of FIG. 13.

A method for fabricating a nonvolatile memory device according to another embodiment will be described with reference to FIGS. 13 and 14. FIG. 13 illustrates a plan view of a nonvolatile memory device according to another embodiment. FIG. 14 illustrates a cross-sectional view along line A-A' of FIG. 13.

Referring to FIGS. 13 and 14, a nonvolatile memory device may include a memory cell region MC and peripheral regions ST around the memory cell region MC. The trap structure 140 may be disposed in the memory cell region MC. The memory cell region MC may have the trap structure 140 or the trap structure 142 described previously with reference to FIG. 6 or 11. Thus, descriptions of the same parts as the above embodiments will not be repeated. As illustrated in FIGS. 13 and 14, the peripheral regions ST may include select transistors and contacts 175 electrically connected to memory cells.

The select transistors may have a structure similar to that of each of the memory cells storing charges. That is, in the select transistors, a gate insulation layer 145 instead of the trap structure may be disposed on a lower portion of a select gate line 155, i.e., between the channel region 104 and the select gate line 155. Source and drain regions 160 disposed along a side of the select gate line 155 may be electrically connected to the contacts 175.

In the nonvolatile memory device including the select gate line 155 and the contacts 175, when the charges are trapped in the memory regions 122a of the charge trapping layer 120 in the memory cell region MC, the charges may not be trapped in the gate insulation layer 145 disposed on the lower portion of the select gate line 155.

Thus, trapping charges in the charge blocking regions 122b of the charge trapping layer 120 due to lateral diffusion of the charges by a thermal treatment process during the initialization process of the nonvolatile memory device may occur only in the memory cell region MC, in which memory cells may be densely disposed.

Figure 15:
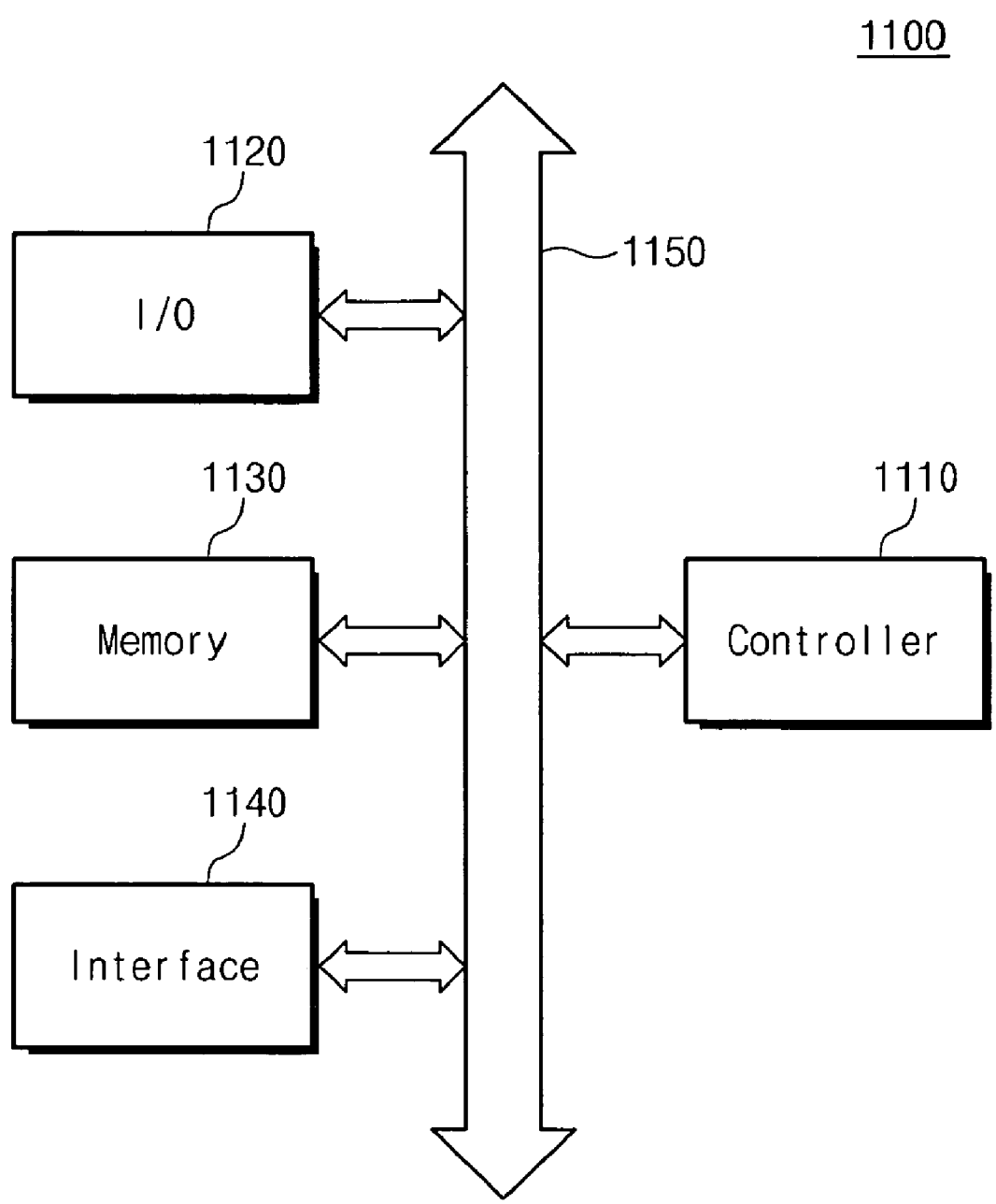
FIG. 15 illustrates a schematic view of a memory system including a nonvolatile memory device according to an embodiment.

FIG. 15 illustrates a schematic view of a memory system including a nonvolatile memory device according to embodiments.

Referring to FIG. 15, a memory system 1100 may be applied to, e.g., a personal digital assistant (PDA), a portable computer, a web tablet, a wireless phone, a mobile phone, a digital music player, a memory card, and devices capable of transmitting and receiving information in wireless environment.

The memory system 1100 may include a controller 1110, an input/output device 1120, a memory 1130, an interface 1140, and a bus 1150. The memory 1130 and the interface 1140 may communicate with each other through the bus 1150.

The controller 1110 may be at least one of, e.g., a microprocessor, a digital signal processor, a microcontroller, and different process devices capable of performing those similar to functions thereof. The memory 1130 may store commands executed by the controller 1110. The input/output device 1120 may receive data or signals from the outside of the memory system 1100, and may transmit data or signals into the outside of the memory system 1100. For example, the input/output device 1120 may include, e.g., a keyboard, a keypad, a display device, and so forth.

The memory 1130 may include a nonvolatile memory device according to embodiments. The memory 1130 may further include different type memories, randomly accessible nonvolatile memories, and various types of memories. The interface 1140 may transmit or receive data via a communication network.

Figure 16:
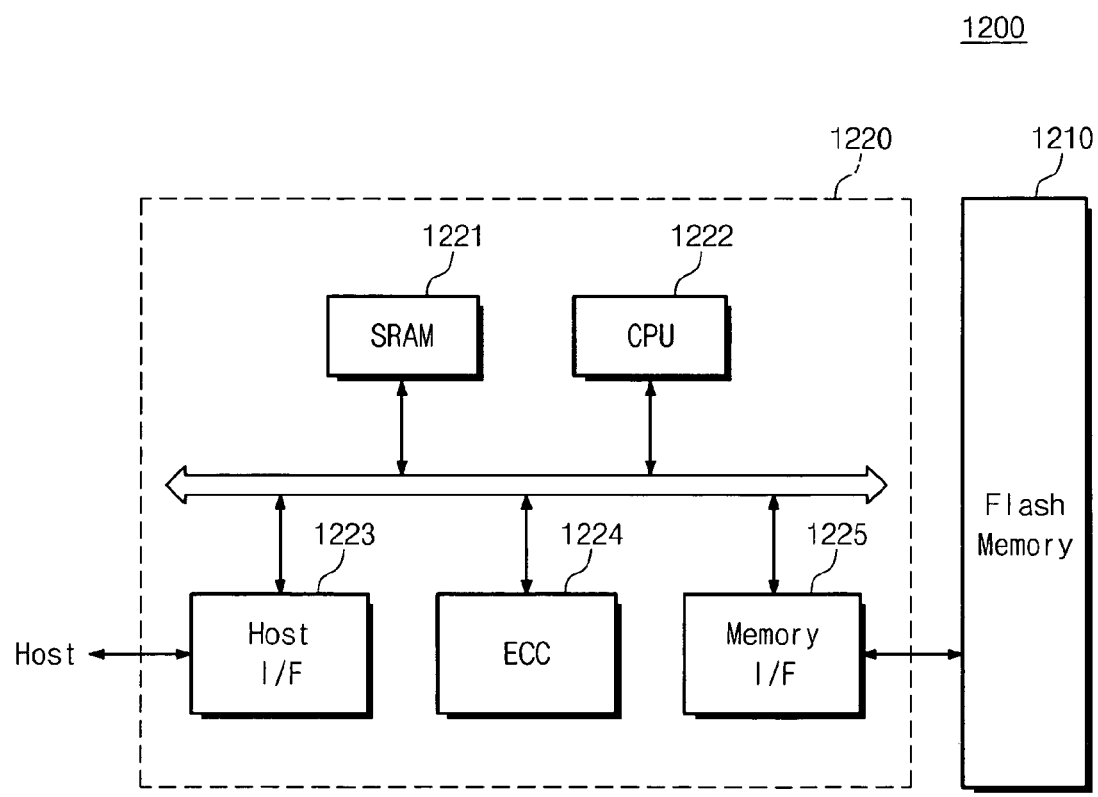
FIG. 16 illustrates a simplified block diagram of a memory card including a flash memory device according to an embodiment.

FIG. 16 illustrates a simplified block diagram of one example of a memory card including a flash memory device according to an embodiment.

Referring to FIG. 16, a memory card 1200 for supporting high data storage capacity may include a flash memory device 1210 according to embodiments. The memory card 1200 may include a memory controller 1220 for controlling general data exchange between a host and the flash memory device 1210.

SRAM 1221 may be used as an operating memory of a central processing unit (CPU) 1222. A host interface 1223 may include a data exchange protocol of the host connected to the memory card 1200. An error correction block 1224 may detect and correct errors included in data read from the multibit flash memory device 1210. A memory interface 1225 may interface with the flash memory device 1210. The CPU 1222 may perform general control operations for data exchange of the memory controller 1220. Although not shown, it may be apparent to those skilled in the art that the memory card 1200 may further include ROM (not shown) for storing code data to interface with the host.

According to the flash memory device and the memory card or memory system, a highly reliable memory system may be provided through the flash memory device 1210 having the improved erasing characteristic of dummy cells. Especially, the flash memory device according to embodiments may be provided in the memory system, e.g., a recent solid state disk (SSD), which is actively under development. In this case, read errors caused from dummy cells may be prevented to realize the highly reliable memory system.

Figure 17:
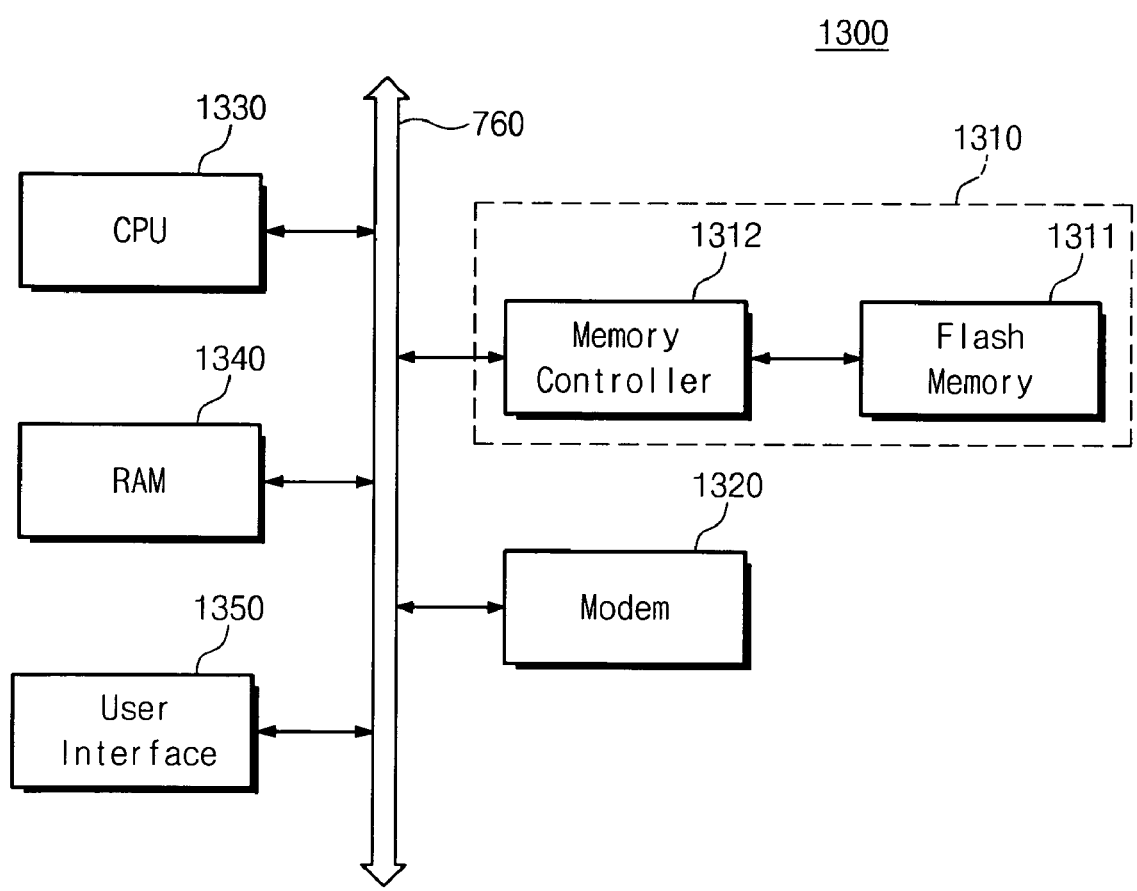
FIG. 17 illustrates a simplified block diagram of an information process system including a flash memory system according to an embodiment.

FIG. 17 illustrates a simplified block diagram of an information process system including a flash memory system according to embodiments.

Referring to FIG. 17, a flash memory system 1310 may be installed in an information processing system 1300, e.g., a mobile device or a desktop computer. The information processing system 1300 according to embodiments may include a modem 1320 electrically connected to the flash memory system 1310 and each system bus 1360, a CPU 1330, a RAM 1340, and a user interface 1350. The flash memory system 1310 may substantially have the same configuration as the above-mentioned memory system or flash memory system. The flash memory system 1310 may store data processed by the CPU 1330 or data input from the outside. Here, the flash memory system 1310 may include SSD. In this case, the information process system 1300 may stably store high capacity data in the flash memory system 1310. As its reliability is increased, the flash memory system 1310 may save resources consumed for correcting errors, and thus may provide a high-speed data exchange function to the information processing system 1300. Although not shown, it is apparent to those skilled in the art that the information processing system 1300 may further include, e.g., an application chipset, a camera image processor (CIS), and an input/output device.

The flash memory device or the memory system according to embodiments may be mounted to various shapes of packages. Examples of the various packages may include a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP), a wafer-level processed stack package (WSP), etc.

According to embodiments, in methods of fabricating the nonvolatile memory device, the charges may be trapped in the charge blocking regions of the charge trapping layer including the memory regions and the charge blocking regions. Thus, when the nonvolatile memory device is programmed, the charges of the charge blocking regions of the charge trapping layer may prevent the charges stored in the memory regions of the charge trapping layer from being laterally diffused.

That is, since a loss of the charge stored in the memory regions of the charge trapping layer may be reduced, the charge retention characteristics of the nonvolatile memory device may be improved. Therefore, the nonvolatile memory device may have improved reliability.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for fabricating a nonvolatile memory device, the method comprising:
    forming a charge trapping layer on a semiconductor substrate, the charge trapping layer including at least one memory region and at least one charge blocking region;
    forming a gate electrode layer on the charge trapping layer; and
    after forming the gate electrode layer, applying different voltages to the semiconductor substrate and the gate electrode layer to create an electrical potential across the charge trapping layer; and
    trapping charges in the charge blocking region of the charge trapping layer.

2. The method as claimed in claim 1, wherein:
forming the charge trapping layer includes forming a plurality of memory regions and a plurality of charge blocking regions in the charge trapping layer, and
the charge trapping layer is formed in a flat plate shape on the semiconductor substrate, such that the charge blocking regions surround each of the memory regions.

3. The method as claimed in claim 1, wherein:
forming the charge trapping layer includes forming a plurality of memory regions and a plurality of charge blocking regions in the charge trapping layer, and
the charge trapping layer is formed in a line shape on the semiconductor substrate, such that each memory region is between two charge blocking regions.

4. The method as claimed in claim 1, wherein trapping the charges in the charge blocking region includes:
electrically trapping charges from the semiconductor substrate in the memory region of the charge trapping layer; and
diffusing at least a portion of the charges trapped in the memory region of the charge trapping layer into the charge blocking region of the charge trapping layer to trap the charges in the charge blocking region of the charge trapping layer.

5. The method as claimed in claim 4, wherein diffusing the charges trapped in the memory region of the charge trapping layer into the charge blocking region includes thermally treating the charge trapping layer to diffuse the charges of the memory region into the charge blocking region.

6. The method as claimed in claim 5, wherein thermally treating the charge trapping layer includes performing a bake process at a temperature ranging from about 100° C. to about 200° C. for a time period ranging from about one hour to about one hundred hours.

7. The method as claimed in claim 4, wherein electrically trapping the charges in the memory region and diffusing the charges of the memory region into the charge blocking region are performed alternately and repeatedly two or more times.

8. The method as claimed in claim 1, further comprising selecting defective cells in memory cells of the nonvolatile memory device before and after the charges are trapped in the charge blocking region of the charge trapping layer.

9. The method as claimed in claim 1, wherein applying the different voltages to the semiconductor substrate and the gate electrode layer to create the electrical potential across the charge trapping layer and trapping charges in the charge blocking region are performed before the nonvolatile memory device is packaged.

10. A method for fabricating a nonvolatile memory device, the method comprising:
preparing a semiconductor substrate including channel regions;
forming a trap structure on the semiconductor substrate, the trap structure including a charge tunneling layer, a charge trapping layer, and a charge blocking layer on the semiconductor substrate;
forming gate electrodes on the trap structure;
after forming the gate electrodes, applying different voltages to the semiconductor substrate and the gate electrodes to create an electrical potential across the charge trapping layer so as to trap charges in the charge trapping layer in regions over the channel regions; and
laterally diffusing the charges trapped in the charge trapping layer over the channel regions into regions of the charge trapping layer around the channel regions.

11. The method as claimed in claim 10, wherein:
the channel regions are arranged in a matrix shape, and
the trap structure has a line shape, such that each trap structure and a respective gate electrode completely overlap each other, the charges being laterally diffused to overlap two sides of each region over a respective channel region.

12. The method as claimed in claim 10, wherein:
the channel regions are arranged in a matrix shape, and
the trap structure overlaps a plurality of gate electrodes, such the charges are laterally diffused to surround a perimeter of each region over a respective channel region.

13. The method as claimed in claim 10, wherein trapping the charges in the charge trapping layer over the channel regions includes generating an electric potential difference between the gate electrodes and the semiconductor substrate to tunnel the charges from the semiconductor substrate to the charge trapping layer.

14. The method as claimed in claim 10, wherein laterally diffusing the charges trapped in the charge trapping layer disposed above the channel regions includes thermally treating the charge trapping layer.

15. The method as claimed in claim 14, wherein thermally treating the charge trapping layer includes performing a bake process at a temperature ranging from about 100° C. to about 200° C. for a time period ranging from about one hour to about one hundred hours.

16. The method as claimed in claim 10, further comprising selecting defective cells in memory cells of the nonvolatile memory device after the gate electrodes are formed.

17. The method as claimed in claim 10, further comprising selecting defective cells in memory cells of the nonvolatile memory device after the charges are trapped in the charge trapping layer except the charge trapping layer over the channel region.

18. The method as claimed in claim 10, wherein laterally diffusing charges is performed before the nonvolatile memory device is finalized as a finished product.

19. The method as claimed in claim 9, further comprising, after applying the different voltages to the semiconductor substrate and the gate electrode layer to create the electrical potential across the charge trapping layer and after trapping charges in the charge blocking region, and before the nonvolatile memory device is packaged, patterning the gate electrode layer to form a plurality of gate electrodes.

20. The method as claimed in claim 10, further comprising, after applying the different voltages to the semiconductor substrate and the gate electrode to create the electrical potential across the charge trapping layer so as to trap charges in the charge trapping layer, packaging the nonvolatile memory device.

* * * * *